US009793092B2

(12) United States Patent
Muramatsu et al.

(10) Patent No.: US 9,793,092 B2
(45) Date of Patent: Oct. 17, 2017

(54) CHARGED PARTICLE BEAM APPARATUS AND PROCESSING METHOD

(71) Applicant: HITACHI HIGH-TECH SCIENCE CORPORATION, Minato-ku, Tokyo (JP)

(72) Inventors: Masashi Muramatsu, Tokyo (JP); Tomokazu Kozakai, Tokyo (JP); Fumio Aramaki, Tokyo (JP)

(73) Assignee: HITACHI HIGH-TECH SCIENCE Corporation (JP)

( * ) Notice: Subject to any disclaimer, the term of this patent is extended or adjusted under 35 U.S.C. 154(b) by 2 days.

(21) Appl. No.: 14/601,446

(22) Filed: Jan. 21, 2015

(65) Prior Publication Data

US 2015/0206708 A1    Jul. 23, 2015

(30) Foreign Application Priority Data

Jan. 22, 2014    (JP) .................. 2014-009679

(51) Int. Cl.
*H01J 37/304*    (2006.01)
*H01J 37/22*    (2006.01)
*H01J 37/28*    (2006.01)
*G21K 5/02*    (2006.01)

(52) U.S. Cl.
CPC .......... *H01J 37/304* (2013.01); *H01J 37/222* (2013.01); *H01J 37/28* (2013.01); *G21K 5/02* (2013.01); *H01J 2237/04* (2013.01); *H01J 2237/08* (2013.01); *H01J 2237/15* (2013.01); *H01J 2237/2806* (2013.01); *H01J 2237/317* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,796,801 B2 * | 9/2010 | Kitamura | ................. | G06K 9/00 348/125 |
| 2008/0124816 A1 * | 5/2008 | Bruland | ............. | B23K 26/0613 438/6 |

(Continued)

FOREIGN PATENT DOCUMENTS

| | | |
|---|---|---|
| JP | 4017248 | 1/1992 |
| JP | 1993004660 | 1/1993 |

(Continued)

*Primary Examiner* — Phillip A Johnston
*Assistant Examiner* — Hsien Tsai
(74) *Attorney, Agent, or Firm* — Adams & Wilks

(57) ABSTRACT

A charged particle beam apparatus has a charged particle beam column configured to irradiate a charged particle beam, and a controller configured to control the charged particle beam column to irradiate the charged particle beam at a first pixel interval for a first region and to irradiate the charged particle beam at a second pixel interval different from the first pixel interval for a second region included in the first region. The first and second regions include plural first and second pixels each including first and second sub-pixels which are irradiated by the charged particle beam to generate secondary electrons. First and second sub-pixel images are formed based on the detected secondary electrons, and the first and second sub-pixel images are synthesized to form first and second images.

6 Claims, 13 Drawing Sheets

(56) References Cited

U.S. PATENT DOCUMENTS

| | | | | |
|---|---|---|---|---|
| 2008/0292343 A1* | 11/2008 | Gomi | ................... | G03G 15/326 399/51 |
| 2009/0084954 A1* | 4/2009 | Ezumi | ................ | G01N 23/2251 250/307 |
| 2012/0001070 A1* | 1/2012 | Takagi | ............... | G02B 21/0004 250/310 |

FOREIGN PATENT DOCUMENTS

| | | |
|---|---|---|
| JP | 7335167 | 12/1995 |
| JP | 2010009987 | 1/2010 |
| WO | 2012155267 | 11/2012 |

\* cited by examiner

CHARGED PARTICLE BEAM APPARATUS AND PROCESSING METHOD

CROSS-REFERENCE TO RELATED APPLICATION

This application claims priority from Japanese Patent Application No. 2014-009679, filed on Jan. 22, 2014, the entire subject matter of which is incorporated herein by reference.

BACKGROUND

1. Technical Field

The present invention relates to a charged particle beam apparatus and a processing method.

2. Description of the Related Art

Hitherto, a processing apparatus that performs processing by beam irradiation has been known (for example, see JP-B2-1993-004660). It is also known that processing accuracy is improved by increasing a field-of-view magnification and reducing a beam diameter.

However, when a field-of-view magnification is increased in order to perform processing with a high level of accuracy, a processing region may not fall within one field of view (FOV). FIGS. 12A and 12B are a schematic diagram showing an example of a screen displayed on a display unit of a processing apparatus which is known in the related art. FIG. 12A is a schematic diagram showing an example of a screen on which a processing region is displayed at a low magnification. In the example shown in the drawing, the entirety of a processing region 901 is displayed. FIG. 12B is a schematic diagram showing an example of a screen on which a processing region is displayed at a high magnification. In the example shown in the drawing, only a region 902 which is a portion of the processing region 901 is displayed. In this manner, when a field-of-view magnification is increased, the entire processing region may not be displayed within one screen.

In addition, the upper limit of the number of beams with which a range capable of being displayed on one screen can be irradiated is determined. Accordingly, when a beam is narrowed in order to increase processing accuracy and processing is performed at a magnification for making a processing region fall within one screen in a state where a beam diameter is smaller than a pixel pitch, a portion which is not irradiated with the beam is generated within a processing range. FIG. 13 is a schematic diagram showing a processing example in a case where processing is performed at a magnification for making a processing region fall within one screen in a state where a beam diameter is smaller than a pixel pitch, using a processing apparatus which is known in the related art. In the example shown in the drawing, a portion which is not irradiated with a beam remains, and thus a processing result became spotted.

SUMMARY

The present invention has been made in view of the above-described circumstances, and one of objects of the present invention is to provide a charged particle beam apparatus and a processing method which are capable of displaying the entirety of a processing region within one screen and performing processing with a higher level of accuracy.

According to an exemplary embodiment of the present invention, there is provided a charged particle beam apparatus including: a charged particle beam column configured to irradiate a charged particle beam; and a controller configured to control the charged particle beam column to irradiate the charged particle beam at a first pixel interval for a first region and to irradiate the charged particle beam at a second pixel interval different from the first pixel interval for a second region included in the first region.

According to another exemplary embodiment of the present invention, there is provided a processing method including: controlling a charged particle beam column to irradiate the charged particle beam at a first pixel interval for a first region; and controlling the charged particle beam column to irradiate the charged particle beam at a second pixel interval different from the first pixel interval for a second region included in the first region.

BRIEF DESCRIPTION OF THE DRAWINGS

The above and other aspects of the present invention will become more apparent and more readily appreciated from the following description of illustrative embodiments of the present invention taken in conjunction with the attached drawings, in which.

DETAILED DESCRIPTION

Hereinafter, embodiments of the present invention will be described with reference to the drawings.

(First Embodiment)

Figure 1:
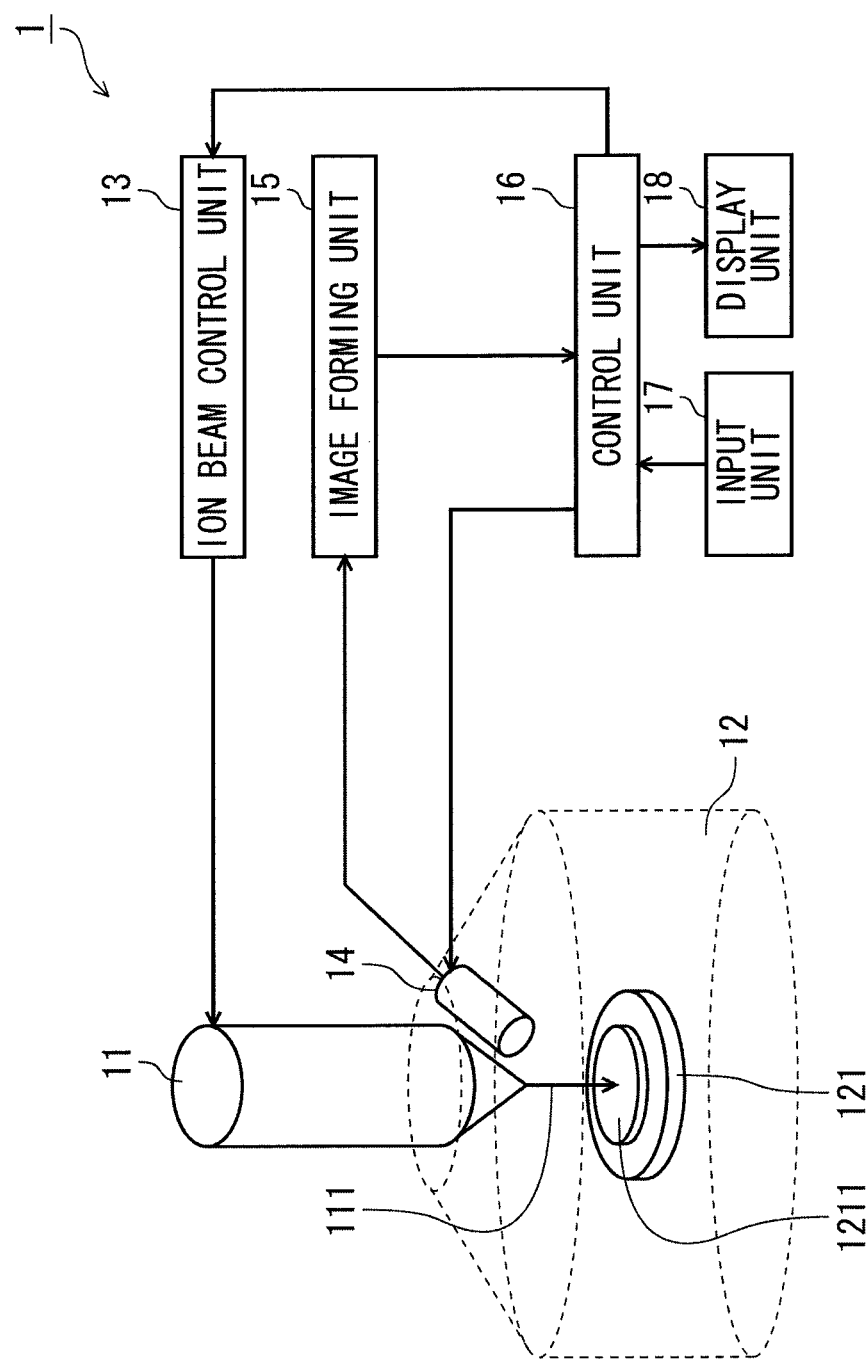
FIG. 1 is a schematic diagram showing the configuration of a processing apparatus according to a first embodiment according to the present invention.

Hereinafter, a first embodiment according to the present invention will be described with reference to the accompanying drawings. FIG. 1 is a schematic diagram showing the configuration of a processing apparatus (charged particle beam apparatus) according to this embodiment. In the example shown in the drawing, a processing apparatus 1 includes an ion beam column 11 (charged particle beam column), a sample chamber 12, an ion beam control unit 13, a secondary electron detector 14, an image forming unit 15, a control unit 16, an input unit 17, and a display unit 18.

The ion beam column 11 performs irradiation with an ion beam 111. The sample chamber 12 accommodates a sample stage 121. The sample stage 121, which is a stage for mounting a sample 1211, can move, be inclined, and rotate at least in a two-dimensional direction. The ion beam column 11 is disposed so as to be able to irradiate the sample 1211 mounted on the sample stage 121 with the ion beam 111. The sample 1211 is an object to be processed. When the sample 1211 is irradiated with the ion beam 111 by the ion beam column 11, the sample generates secondary electrons.

The ion beam control unit 13 outputs an irradiation signal to the ion beam column 11 and causes the ion beam column 11 to perform irradiation with the ion beam 111. In addition, the ion beam control unit 13 controls an input of the ion beam column 11 to a lens electrode and a scanning electrode to thereby control an irradiation position, a beam diameter, and the amount of beam irradiation of the ion beam 111 with which the ion beam column 11 performs irradiation. The secondary electron detector 14 detects the secondary electrons generated by the sample 1211. The image forming unit 15 forms an SIM image using a signal for performing scanning with the ion beam 111 and a signal of the secondary electrons detected by the secondary electron detector 14.

The control unit 16 controls units included in the processing apparatus 1. The input unit 17 includes, for example, a keyboard and the like and receives various types of input from an operator or the like. The display unit 18 is, for example, a liquid crystal display and displays an SEM image formed by the image forming unit 15, and the like.

Figure 2:
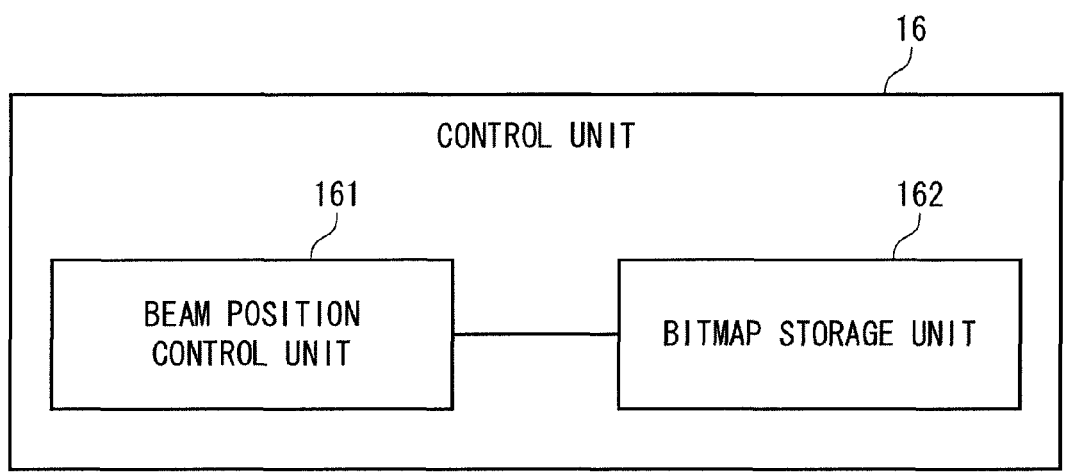
FIG. 2 is a block diagram showing the configuration of a control unit according to the first embodiment according to the present invention.

Next, the control unit 16 will be described. FIG. 2 is a block diagram showing the configuration of the control unit 16 according to this embodiment. In the example shown in the drawing, the control unit 16 includes at least a beam position control unit 161 and a bitmap storage unit 162. The beam position control unit 161 controls the ion beam control unit 13 and controls an irradiation position, a beam diameter, and the amount of beam irradiation of the ion beam 111 with which the ion beam column 11 performs irradiation. The bitmap storage unit 162 stores a bitmap showing a position to be irradiated with the ion beam 111. Meanwhile, for example, the beam position control unit 161 and the ion beam control unit 13 are equivalent to a controller recited in claims.

Next, a processing method of the processing apparatus 1 will be described. One irradiation unit performing irradiation with the ion beam 111 will be referred to as "one pixel", and one irradiation region which is a set of irradiation units will be referred to as "one frame". In this embodiment, scanning is performed multiple times by shifting a position irradiated with the ion beam 111, and the inside of one pixel is irradiated with the ion beam 111 multiple times.

Figure 3D:
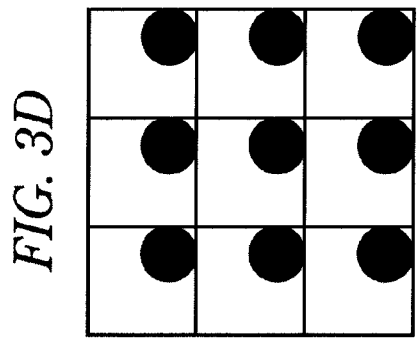
FIGS. 3A to 3D are schematic diagrams showing positions irradiated with an ion beam by the processing apparatus in the first embodiment according to the present invention.
Figure 3C:
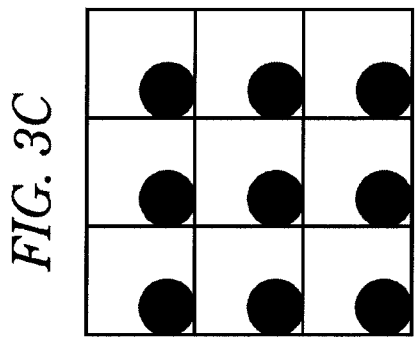
Figure 3B:
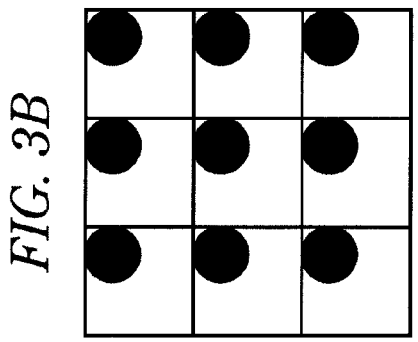
Figure 3A:
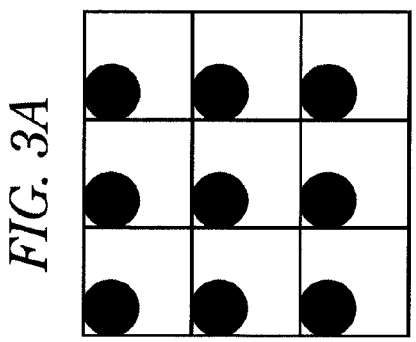

FIGS. 3A to 3D are schematic diagrams showing positions irradiated with the ion beam 111 by the processing apparatus 1 in this embodiment. FIG. 3A is a schematic diagram showing a position irradiated with the ion beam 111 by the ion beam column 11 during a first scanning. In the example shown in the drawing, the position irradiated with the ion beam 111 by the ion beam column 11 during the first scanning is an upper left position of each pixel.

FIG. 3B is a schematic diagram showing a position irradiated with the ion beam 111 by the ion beam column 11 during a second scanning. In the example shown in the drawing, the position irradiated with the ion beam 111 by the ion beam column 11 during the first scanning is an upper right position of each pixel. FIG. 3C is a schematic diagram showing the position irradiated with the ion beam 111 by the ion beam column 11 during a third scanning. In the example shown in the drawing, the position irradiated with the ion beam 111 by the ion beam column 11 during the third scanning is a lower left position of each pixel. FIG. 3D is a schematic diagram showing the position irradiated with the ion beam 111 by the ion beam column 11 during a fourth scanning. In the example shown in the drawing, the position irradiated with the ion beam 111 by the ion beam column 11 during the fourth scanning is a lower right position of each pixel.

In this manner, an irradiation process (scanning) of performing irradiation with the ion beam 111 once for each pixel region designated in a bitmap is performed multiple times while moving an irradiation position so that the irradiation position is different within each pixel region. That is, irradiation with the ion beam 111 is performed in units of sub-pixels within each pixel region. In the examples shown in FIG. 3, four sub-pixels are included in each pixel region. Thereby, it is possible to reduce portions which are not irradiated with the ion beam 111.

Meanwhile, the number of times of scanning (the number of irradiation processes) is four in the examples shown in FIG. 3, but is not limited thereto. For example, an FOV including the entire processing region is set to FOV_A. In addition, an FOV equivalent to a target level of accuracy is set to FOV_B. In this case, an amount by which a position irradiated with the ion beam 111 is shifted for one scanning (the amount of shifting, the amount of sub-pixels) is a pixel size of FOV_B. In addition, the total number of times of scanning is ((FOV_A)/(FOV_B)) by ((FOV_A)/(FOV_B)).

For example, when the irradiation position of the ion beam 111 can be moved in units of one-sixteenth of one pixel, scanning is performed 256 times while shifting the irradiation position of the ion beam 111 in units of one-sixteenth of one pixel both crosswise and lengthwise, and thus it is possible to perform processing with a higher level of accuracy.

In addition, since the same scan data is used during each scanning, it is possible to perform processing without increasing the amount of data. For example, when scan data is created so that the inside of one pixel is irradiated with the ion beam 111 multiple times through one scanning, the amount of data is increased further than scan data for irradiating the inside of one pixel with the ion beam 111 once through one scanning. However, in this embodiment, since scanning is performed multiple times by shifting a position irradiated with the ion beam 111 using scan data for irradiating the inside of one pixel with the ion beam 111 once through one scanning, it is possible to prevent an increase in the amount of scan data.

In this embodiment, the irradiation position of the ion beam 111 is accurately aligned by performing drift correction. During the drift correction, the irradiation position of the ion beam 111 is adjusted based on a correction mark (point hole) which is determined in the sample 1211 in advance and is corrected so that a processing position is not shifted. In this manner, the correction is performed based on the correction mark during the drift correction. For this reason, if the position of the correction mark is not captured with a high level of accuracy, the accuracy of the drift correction deteriorates. The region including a position at which the correction mark is provided is set as a correction mark detection region.

Figure 4B:
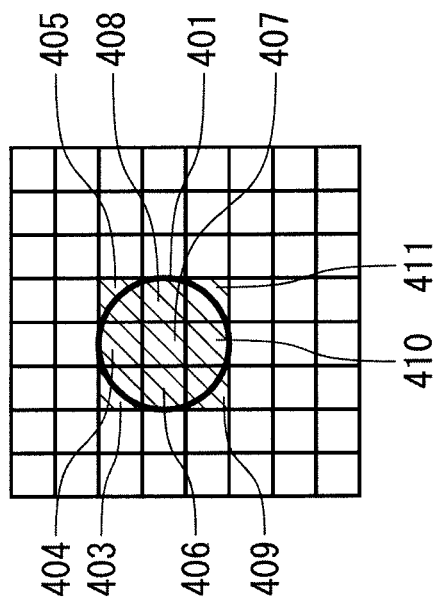
FIGS. 4A and 4B are schematic diagrams showing a relationship between a correction mark and a pixel interval during scanning.
Figure 4A:
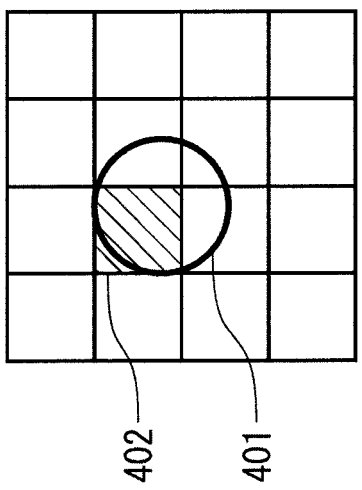

Consequently, in this embodiment, when an image in the vicinity of the correction mark is acquired, scanning is performed by reducing a pixel interval during the scanning, and thus the position of the correction mark is captured with a high level of accuracy. FIGS. 4A and 4B are schematic diagrams showing a relationship between a correction mark and a pixel interval during scanning. FIG. 4A is a schematic diagram showing a relationship between a correction mark and a pixel interval in a case where the pixel interval during scanning is large. In the example shown in the drawing, there is only one pixel 402 among pixels including more than half of a correction mark 401 within a pixel, and the pixel deviates from the centroid of the correction mark 401. FIG. 4B is a schematic diagram showing a relationship between a correction mark and a pixel interval in a case where the pixel interval during scanning is smaller. In the example shown in the drawing, there are nine pixels 403 to 411 among pixels including more than half of a correction mark 401 within a pixel, and the pixels deviate a little from the centroid of the correction mark 401. In this manner, scanning is performed by reducing the pixel interval when acquiring an image in the vicinity of the correction mark 401, and thus it is possible to capture the position of the correction mark 401 with a high level of accuracy.

Figure 5:
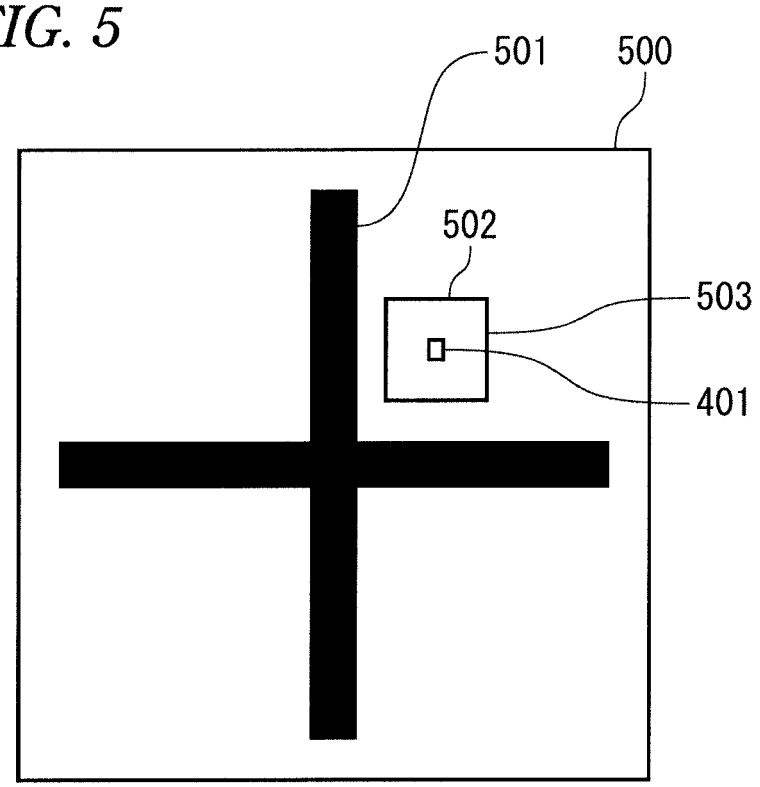
FIG. 5 is a schematic diagram showing a relationship between a field-of-view region with a low magnification and a field-of-view region with a high magnification in the first embodiment according to the present invention.

FIG. 5 is a schematic diagram showing a relationship between a field-of-view region with a low magnification A and a field-of-view region with a high magnification C in this embodiment. In the example shown in the drawing, a field-of-view region 500 with a magnification A for making the entirety of a processing region 501 fall within one screen is shown. The processing region 501 and a drift correction region 502 are included in the field-of-view region 500. In addition, a magnification for making the entire drift correction region 502 fall within one screen is set to a magnification C. That is, a field-of-view region 503 having the magnification C is the same region as the drift correction region 502. The correction mark 401 is included within the drift correction region 502.

Figure 6:
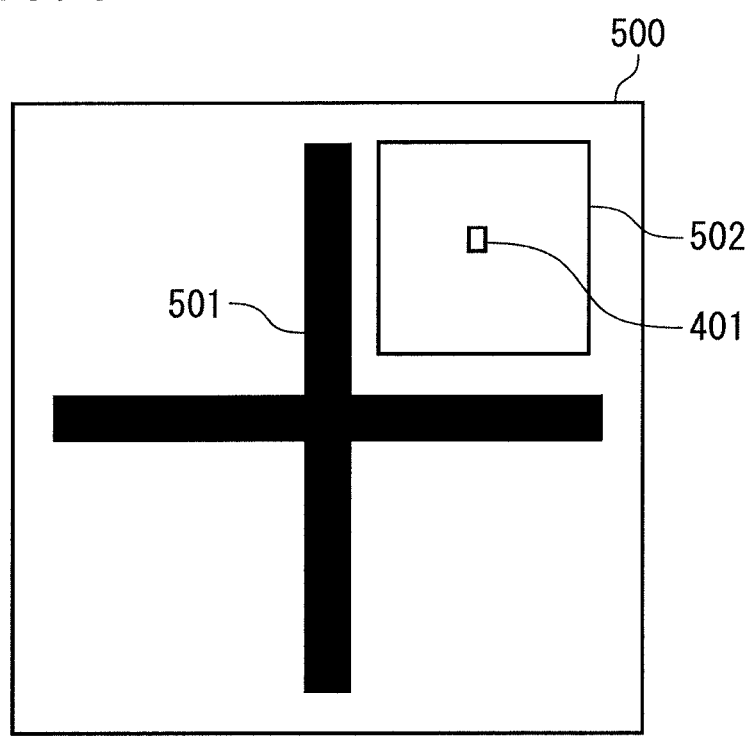
FIG. 6 is a schematic diagram showing a relationship with an image which is acquired by the processing apparatus in the first embodiment according to the present invention.

FIG. 6 is a schematic diagram showing a relationship with an image which is acquired by the processing apparatus 1 in this embodiment. In the example shown in the drawing, an image within the drift correction region 502 is enlarged and displayed, as compared with the drawing shown in FIG. 5. This is because a pixel interval during the scanning of the inside of the drift correction region 502 is narrowed further than during processing. Meanwhile, parts other than the image within the drift correction region 502 are the same as those in the drawing shown in FIG. 5.

For example, an FOV of the field-of-view region 500 including the entire processing region 501 is set to FOV_A. In addition, an FOV of the drift correction region 502 (field-of-view region 503) is set to FOV_C. In this case, the size of a scanned image of the drift correction region 502 is set to (FOV_A)/(FOV_C) times both crosswise and lengthwise. Accordingly, the number of pixels of the scanned image of the drift correction region 502 is set to ((FOV_A)/(FOV_C)) times.

Meanwhile, a bitmap becomes larger in accordance with the size of the processing region 501 in the scanning during processing. However, only the scanning of the drift correction region 502 is performed in the scanning during drift correction. For this reason, the bitmap falls within a creatable size even with a high-definition pixel interval. For example, when a scanning region during the correction of the drift correction region 502 is set to 100 by 100 pixels and a pixel interval during correction scanning is set to one-eighth of the pixel during the processing, the size of the bitmap is set to 800 by 800 pixels. This size is smaller than the size of a screen displayed on the display unit 18 and is a size for which scanning is capable of being performed.

Figure 7:
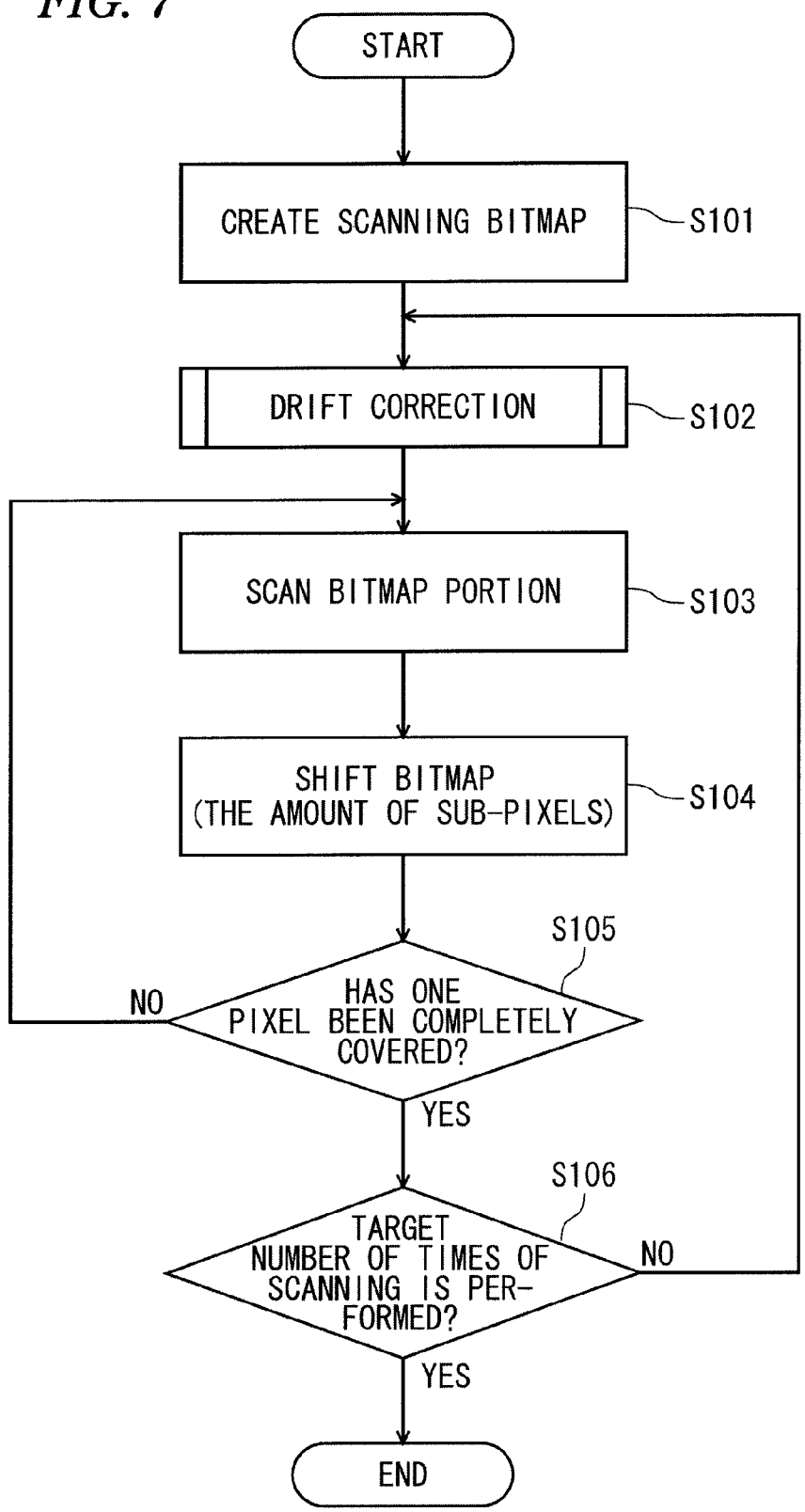
FIG. 7 is a flow chart showing a processing procedure of the processing apparatus according to the first embodiment according to the present invention.

Next, a processing procedure of the processing apparatus 1 will be described. FIG. 7 is a flow chart showing a processing procedure of the processing apparatus 1 according to this embodiment. Meanwhile, in this embodiment, when processing is performed, the field-of-view region 500 including the entire processing region 501 is set.

Step S101: The beam position control unit 161 reads out a bitmap stored in the bitmap storage unit 162 and creates a scanning bitmap. Thereafter, the process proceeds to the process of step S102.

Step S102: The beam position control unit 161 performs drift correction. Thereafter, the process proceeds to the process of step S103. A detailed process procedure of the drift correction will be described later.

Step S103: The beam position control unit 161 controls the ion beam column 11 through the ion beam control unit 13, performs the scanning of a region which is designated in the scanning bitmap created in the process of step S101, and processes the sample 1211. Thereafter, the process proceeds to the process of step S104.

Step S104: The beam position control unit 161 shifts the scanning bitmap by the amount of sub-pixels (an amount by which a position irradiated with the ion beam 111 is shifted for each scanning, the amount of shifting). Thereafter, the process proceeds to the process of step S105.

Step S105: The beam position control unit 161 determines whether or not the inside of each pixel to be processed has been completely covered by the irradiation with the ion beam 111. That is, it is determined whether or not the inside of each pixel to be processed has been completely covered by the irradiation with the ion beam 111 for one pixel. When it is determined that the inside of each pixel to be processed has been completely covered by the irradiation with the ion beam 111 for one pixel, the process proceeds to the process of step S106. Otherwise, the process returns to the process of step S103.

Step S106: The beam position control unit 161 determines whether or not a target number of times of scanning has been performed. When the beam position control unit 161 determines that the target number of times of scanning has been performed, the process is terminated. Otherwise, the process returns to the process of step S102.

Meanwhile, in the example shown in FIG. 7, the drift correction process (process of step S102) is performed whenever one pixel is completely covered by the irradiation with the ion beam 111, but the invention is not limited thereto. For example, the number and intervals of drift correction processes vary depending on a processing material and a target processing accuracy. Accordingly, when the number of drift correction processes is increased, the drift correction process may be performed before one pixel is completely covered by the irradiation with the ion beam 111. In addition, when the number of drift correction processes is reduced, the drift correction process may be performed after a plurality of frames are scanned.

Figure 8:
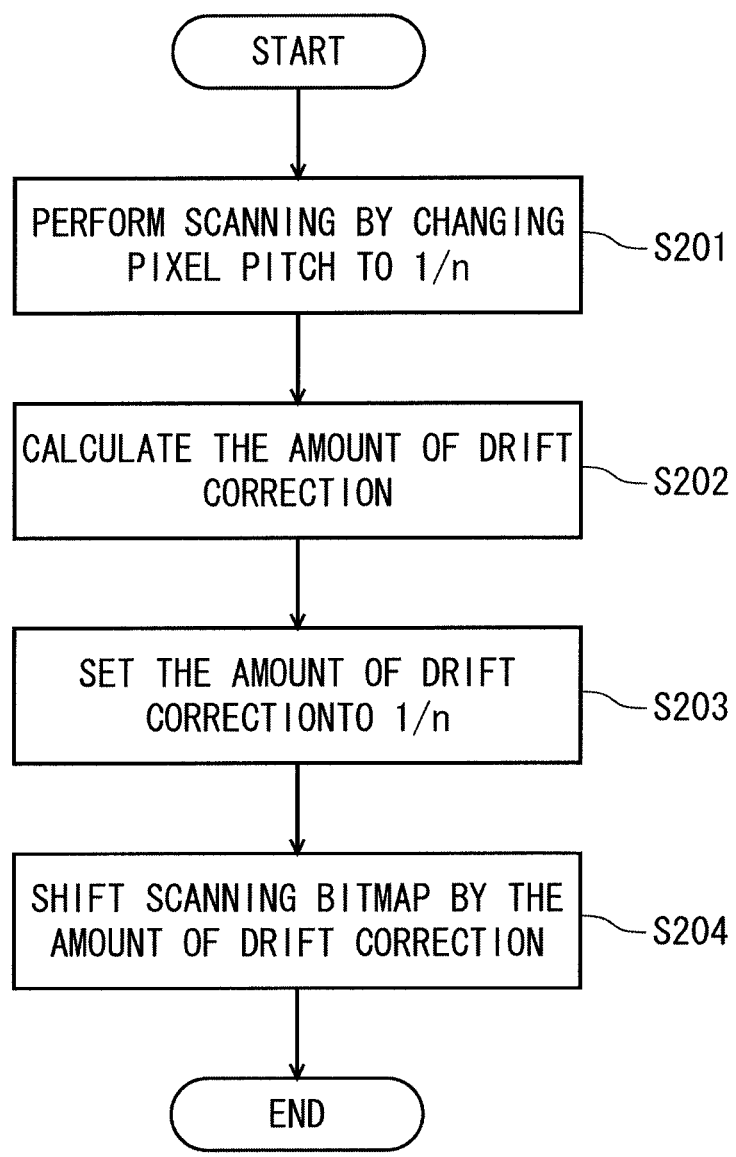
FIG. 8 is a flow chart showing a drift correction process procedure of the processing apparatus according to the first embodiment according to the present invention.

Next, a process procedure of the drift correction of the processing apparatus 1 will be described. FIG. 8 is a flow chart showing a drift correction process procedure of the processing apparatus 1 according to this embodiment.

Step S201: the beam position control unit 161 changes a pixel pitch to 1/n and controls the ion beam column 11 through the ion beam control unit 13 to perform the scanning of the drift correction region 502. Thereafter, the process proceeds to the process of step S202.

Step S202: The beam position control unit 161 calculates the amount of drift correction. Thereafter, the process proceeds to the process of step S203. Meanwhile, for example, a method known in the related art is used as a method of calculating the amount of drift correction. In addition, the amount of drift correction at this point in time is the amount of drift correction when a pixel pitch is set to 1/n times.

Step S203: The beam position control unit 161 sets the amount of drift correction calculated in the process of step S202 to 1/n and converts the amount of drift correction into the amount of drift correction in the field-of-view region 500 including the entire processing region 501. Thereafter, the process proceeds to the process of step S204.

Step S204: The beam position control unit 161 shifts the scanning bitmap by the amount of drift correction which is converted in the process of step S203. Thereafter, the drift correction process is terminated.

As described above, according to this embodiment, the beam position control unit 161 controls the ion beam column 11 through the ion beam control unit 13 to perform a plurality of irradiation processes (scanning) of performing irradiation with the ion beam 111 once for each pixel region designated in the bitmap while moving an irradiation position so that the irradiation position is different within each pixel region. Thereby, it is possible to reduce portions which are not irradiated with the ion beam 111.

In this embodiment, when an image in the vicinity (drift correction region 502) of the correction mark 401 is acquired during the drift correction, the pixel interval during scanning is reduced. Thereby, it is possible to capture the position of the correction mark 401 with a high level of accuracy. Therefore, it is possible to perform the drift correction with a higher level of accuracy.

(Second Embodiment)

Next, a second embodiment will be described. For example, the size of a screen is 800 by 800 pixels, and the above-mentioned ratio of a magnification A which is a low magnification to a magnification C which is a high magnification is set to eight times. In this case, in order to make an image of an enlarged drift correction region 502 fall within one screen, the drift correction region 502 can be secured up to a maximum of 100×100 pixels. Accordingly, when there is a desire to secure the length along an edge as in edge drift correction, it is assumed that the size of the drift correction region 502 is not sufficient.

Consequently, in this embodiment, also when the scanning of the drift correction region 502 is performed, an image with a high magnification is acquired by performing the scanning while performing a shift by a pixel pitch with a magnification C which is a high magnification and by synthesizing acquired images, similarly to the case of the processing of a processing region 501. Meanwhile, the configuration of a processing apparatus 1 according to this embodiment is the same as the configuration of the processing apparatus 1 according to the first embodiment. In addition, a processing procedure of the processing apparatus 1 according to this embodiment is the same as that in the first embodiment, except for a drift correction process.

Figure 9:
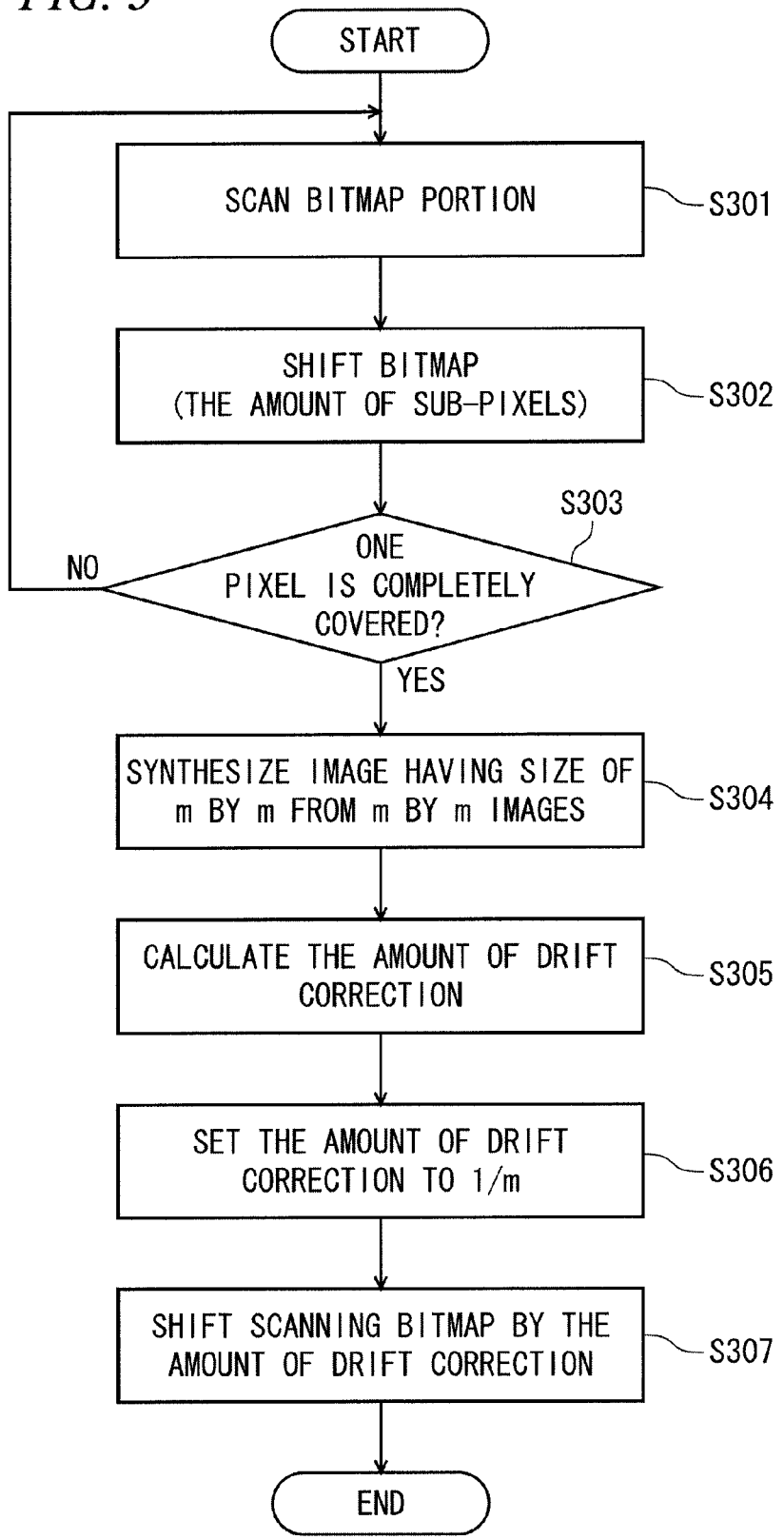
FIG. 9 is a flow chart showing a drift correction process procedure of a processing apparatus according to a second embodiment according to the present invention.

Next, a process procedure of the drift correction of the processing apparatus 1 according to this embodiment will be described. FIG. 9 is a flow chart showing a drift correction process procedure of the processing apparatus 1 according to this embodiment.

Step S301: A beam position control unit 161 controls an ion beam column 11 through an ion beam control unit 13 and performs the scanning of the drift correction region 502. Thereafter, the process proceeds to the process of step S302.

Step S302: The beam position control unit 161 shifts a bitmap of the drift correction region 502 by an amount of sub-pixels (an amount by which a position irradiated with an ion beam 111 is shifted for each scanning, the amount of shifting). Thereafter, the process proceeds to the process of step S303.

Step S303: The beam position control unit 161 determines whether or not the scanning for one pixel (m wide by m long) has been performed. When it is determined that the scanning for one pixel has been performed, the process proceeds to the process of step S304. Otherwise, the process returns to the process of step S301.

Step S304: An image forming unit 15 generates m by m images of the drift correction region 502 based on the result of the scanning performed m wide by m long. In addition, the image forming unit 15 synthesizes the generated m by m images of the drift correction region 502 to thereby generate an image having a size of m by m of the drift correction region 502. Thereafter, the process proceeds to the process of step S305.

Step S305: The beam position control unit 161 calculates the amount of drift correction based on the image having a size of m by m of the drift correction region 502 which is generated in the process of step S304. Thereafter, the process proceeds to the process of step S306. Meanwhile, for example, a method known in the related art is used as a method of calculating the amount of drift correction. In addition, the amount of drift correction at this point in time is the amount of drift correction when a pixel pitch is set to 1/m times.

Step S306: The beam position control unit 161 sets the amount of drift correction calculated in the process of step S305 to 1/m, and converts the amount of drift correction into the amount of drift correction in a field-of-view region 500 including the entire processing region 501. Thereafter, the process proceeds to the process of step S307.

Step S307: The beam position control unit 161 shifts a scanning bitmap by the amount of drift correction which is converted in the process of step S306. Then, the drift correction process is terminated.

As described above, according to this embodiment, also when the scanning of the drift correction region 502 is performed, an image with a high magnification is acquired by performing the scanning while performing a shift by a pixel pitch with a magnification C which is a high magnification and by synthesizing acquired images, similarly to the case of the processing of a processing region 501. Thereby, in a method of scanning only the drift correction region 502 at a high magnification, it is possible to acquire an image with a high magnification of the drift correction region 502 also in a case where the size of the drift correction region 502 is not sufficient. Therefore, it is possible to perform drift correction with a higher level of accuracy.

(Third Embodiment)

Next, a third embodiment will be described. Even when a processing region 501 completely falls within a field-of-view region 500 with a low magnification (magnification A), a drift correction region 502 may not be provided in the vicinity of the processing region 501. Even in this case, if the drift correction region 502 is determined in the wide field-of-view region 500 with a low magnification (magnification A), it is possible to perform accurate processing with a high magnification (magnification C). However, in this case, since the drift correction region 502 becomes distant from the processing region 501, a deviation occurs in the shape of a beam, which results in a concern of accuracy not being improved.

Meanwhile, also in case where the drift correction region 502 and the processing region 501 are separated from each other, the positioning of the drift correction region 502 in a horizontal or vertical direction with respect to the processing region 501 results in only longitudinal and transverse deviations of an ion beam 111. Consequently, in this embodiment, the amounts of drift correction in longitudinal and transverse directions are independently measured, and thus the amount of drift is calculated with a high level of accuracy. Meanwhile, the configuration of a processing apparatus 1 according to this embodiment is the same as the configuration of the processing apparatus 1 according to the first embodiment. In addition, a processing procedure of the processing apparatus 1 according to this embodiment is the same as that in the first embodiment, except that the amounts of drift correction in longitudinal and transverse directions are independently measured.

Figure 10:
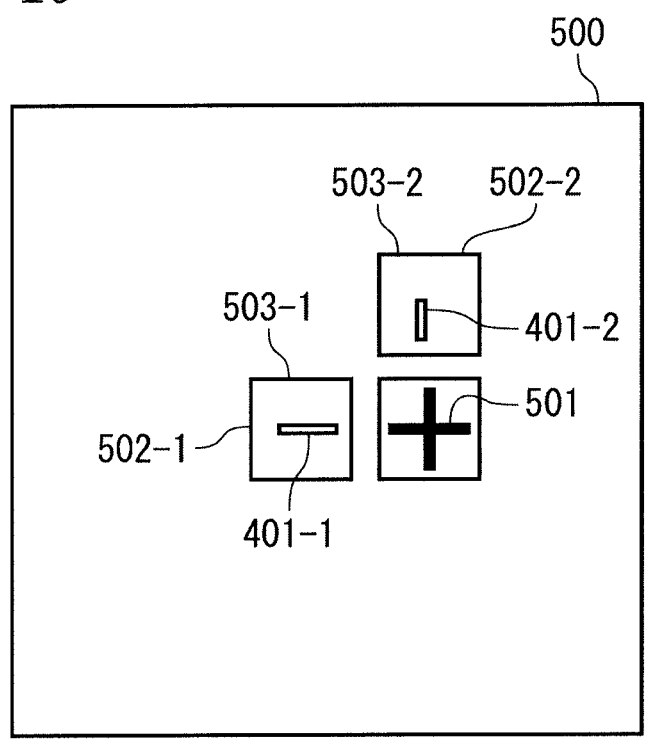
FIG. 10 is a schematic diagram showing a relationship between a processing region, a longitudinal drift correction region, and a transverse drift correction region in a third embodiment according to the present invention.

FIG. 10 is a schematic diagram showing a relationship between a processing region 501, a longitudinal drift correction region 502-1, and a transverse drift correction region 502-2 in this embodiment. In the example shown in the drawing, a field-of-view region 500 with a magnification A for making all of the processing region 501, the longitudinal drift correction region 502-1, and the transverse drift correction region 502-2 fall within one screen is shown. The processing region 501, the longitudinal drift correction region 502-1, and the transverse drift correction region 502-2 are included in the field-of-view region 500.

In addition, a magnification for making the entire longitudinal drift correction region 502-1 fall within one screen is set to a magnification C. In addition, a magnification for making the entire transverse drift correction region 502-2 fall within one screen is set to a magnification C. That is, a field-of-view region 503-1 with a magnification C is the same region as the longitudinal drift correction region 502-1. In addition, a field-of-view region 503-2 with a magnification C is the same region as the transverse drift correction region 502-2. A correction mark 401-1 is included in the longitudinal drift correction region 502-1. A correction mark 401-2 is included in the transverse drift correction region 502-2.

In this manner, the longitudinal drift correction region 502-1 and the transverse drift correction region 502-2 are provided, and the amounts of drift correction in longitudinal and transverse directions are independently measured, and thus it is possible to calculate the amount of drift with a high level of accuracy.

(Fourth Embodiment)

Next, a fourth embodiment will be described. In the first embodiment, a case where a beam diameter is smaller than a pixel size has been described, but the invention is not limited thereto. For example, even when the beam diameter is larger than the pixel size, it is confirmed that the reliability of an image obtained by narrowing a beam interval is increased. From this, even when both the processing region 501 and the drift correction region 502 fall within a field of view with a high magnification (magnification C), an image of the drift correction region 502 becomes finer by using the drift correction described in the first embodiment, and thus it is possible to expect to increase the accuracy of drift correction.

Figure 11:
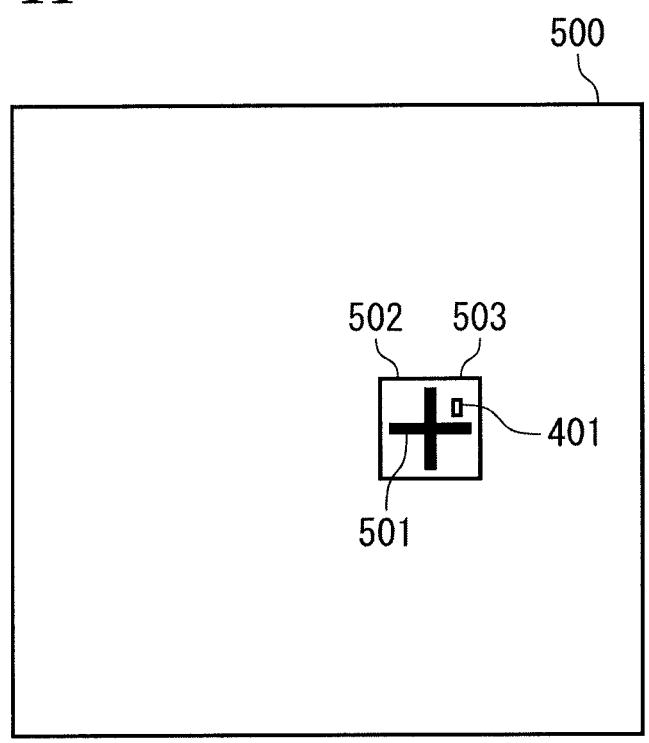
FIG. 11 is a schematic diagram showing a relationship between a processing region and a drift correction region in a fourth embodiment according to the present invention.
Figure 12B:
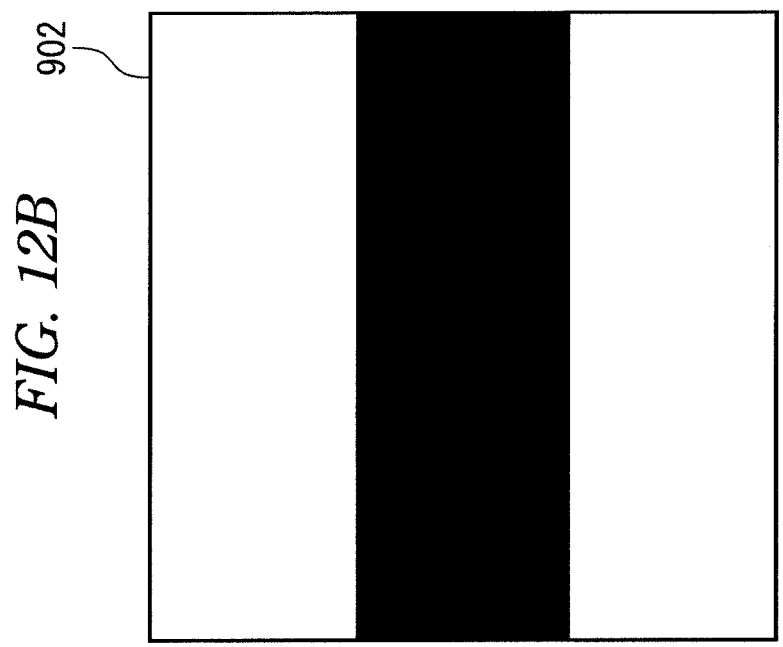
FIGS. 12A and 12B are schematic diagrams showing an example of a screen displayed on a display unit of a processing apparatus which is known in the related art.
Figure 12A:
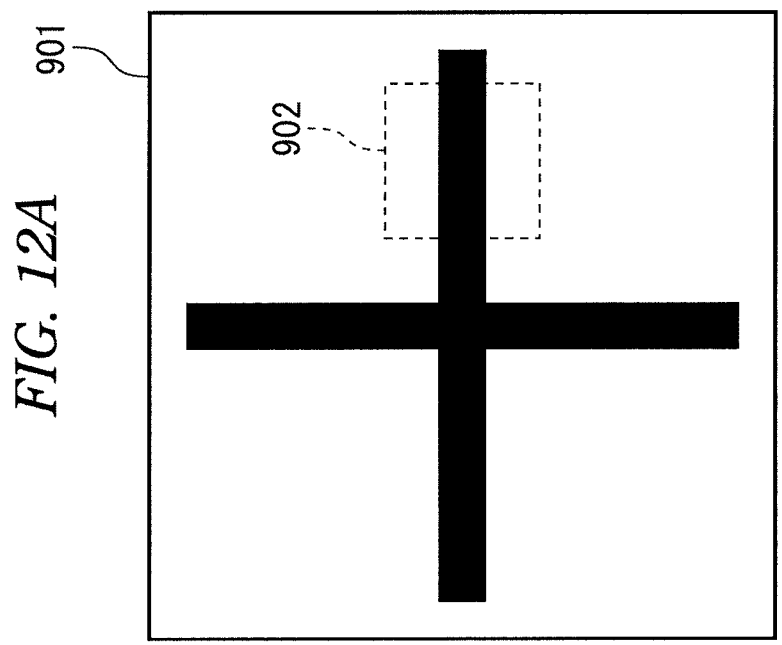
Figure 13:
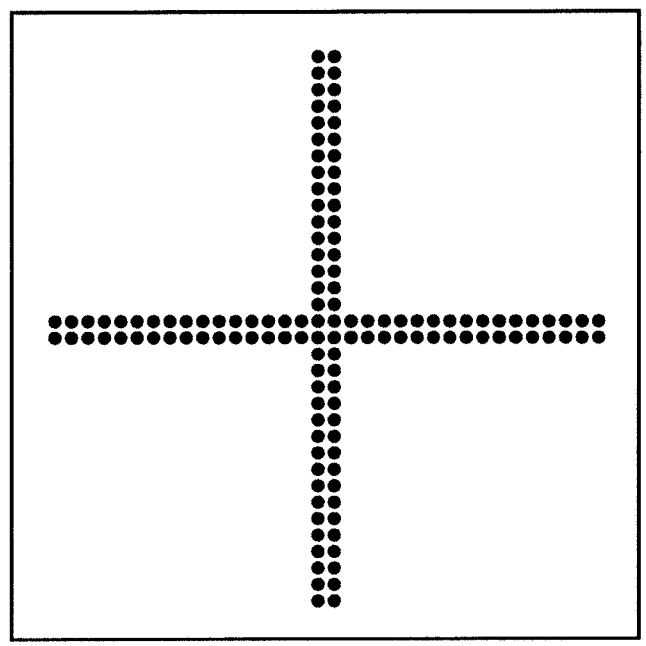
FIG. 13 is a schematic diagram showing a processing example in a case where processing is performed at a magnification for making a processing region fall within one screen in a state where a beam diameter is smaller than a pixel pitch, using a processing apparatus which is known in the related art.

FIG. 11 is a schematic diagram showing a relationship between the processing region 501 and the drift correction region 502 in this embodiment. In the example shown in the drawing, a field-of-view region 500 with a low magnification (magnification A) is shown. A drift correction region 502 is included in the field-of-view region 500. A processing region 501 is included in the drift correction region 502. That is, both the processing region 501 and the drift correction region 502 fall within a field of view 503 with a high magnification (magnification C).

In this manner, even when both the processing region 501 and the drift correction region 502 fall within a field of view with a high magnification (magnification C), an image of the drift correction region 502 becomes finer by using the drift correction described in the first embodiment, and thus it is possible to expect to increase the accuracy of drift correction.

Meanwhile, all or some of the functions of the units included in the processing apparatus 1 according to the above-described first to fourth embodiments may be realized by recording a program for realizing the functions in a computer-readable recording medium, by causing a computer system to read the program recorded in the recording medium, and by executing the program. Meanwhile, the term "computer system" used herein includes hardware such as an OS and a peripheral device.

In addition, the "computer-readable recording medium" refers to a portable medium such as a flexible disk, a magneto-optical disc, a ROM, and a CD-ROM and a storage unit such as a hard disk which is built into a computer system. Further, the "computer-readable recording medium" may include one that dynamically holds a program for a short period of time such as a communication line for transmitting a program through a network such as the Internet or a communication line such as a telephone line, and may include one that holds the program for a certain period of time, such as a volatile memory within a computer system serving as a server or a client. In addition, the above-mentioned program may be one for realizing a portion of the above-mentioned functions, or may realize the above-mentioned functions in combination with a program that has been already stored in the computer system.

The first to fourth embodiments according to the present invention have been described so far in detail with reference to the accompanying drawings. However, a specific configuration is not limited to the embodiments, and a design and the like are included without departing from the scope of the invention. For example, in the above-described embodiments, an ion beam has been used and described as an example of a charged particle beam, but the invention is not limited thereto: For example, an electron beam may be used as the charged particle beam.

What is claimed is:

1. A charged particle beam apparatus comprising:
a charged particle beam column configured to irradiate a charged particle beam to a first region and a second region of a sample, the second region included in the first region;
a controller configured to control the charged particle beam column to irradiate the charged particle beam to the first region and the second region of the sample, the first region including a plurality of first pixels at a first pixel interval, each of the first pixels including a first predetermined number of first sub-pixels, the second region including a plurality of second pixels at a second pixel interval different from the first pixel interval, each of the second pixels including a second predetermined number of second sub-pixels, wherein the controller is configured to control the charged particle beam column to irradiate the charged particle beam to each of the first sub-pixels at the first pixel interval for the first region and to irradiate the charged particle beam to each of the second sub-pixels at the second pixel interval for the second region;
a secondary electron detector configured to detect first secondary electrons for each of the first sub-pixels generated by irradiating the charged particle beam to each of the first sub-pixels at the first pixel interval for the first region, to generate a first signal of the first secondary electrons for each of the first sub-pixels, to detect second secondary electrons for each of the second sub-pixels generated by irradiating the charged particle beam to each of the second sub-pixels at the second pixel interval for the second region, and to generate a second signal of the second secondary electrons for each of the second sub-pixels; and
an image forming unit configured to form first sub-pixel images by using the first signal, the number of the first sub-pixel images being the first predetermined number, to generate a first image by synthesizing the predetermined number of the first sub-pixel images, and to form second sub-pixel images by using the second signal, the number of the second sub-pixel images being the second predetermined number, to generate a second image by synthesizing the predetermined number of the second sub-pixel images.

2. The charged particle beam apparatus according to claim 1, wherein the second region is a correction mark detection region that includes a position at which a correction mark is provided.

3. The charged particle beam apparatus according to claim 1, wherein the controller controls the charged particle beam column to perform an irradiation process of irradiating the charged particle beam once for each pixel region designated in a bitmap for multiple times while displacing an irradiation position of the charged particle beam within each pixel region for each of the irradiation process for each pixel.

4. The charged particle beam apparatus according to claim 3, wherein the controller operates to:
control the charged particle beam column to perform scanning of a drift correction region with a first pixel pitch that is smaller than a second pixel pitch of the bitmap;
calculate a first amount of drift correction based on information obtained through the scanning; and
perform drift correction by converting the first amount of drift correction into a second amount of drift correction for the second pixel pitch of the bitmap.

5. The charged particle beam apparatus according to claim 3, wherein when a field of view of the bitmap is set to FOV_A and a field of view having an amount, by which the irradiation position is displaced, the same with a pixel size is set to FOV_B, the controller controls the charged particle beam column to perform the irradiation process for at least (FOV_A/FOV_B) by (FOV_A/FOV_B) times in total within the first region.

6. A processing method of a sample including a first region and a second region, the second region included in the first region, the method comprising:
controlling a charged particle beam column to irradiate a charged particle beam to the first region and the second region of the sample, the first region including a plurality of first pixels at a first pixel interval, each of the first pixels including a first predetermined number of first sub-pixels, the second region including a plurality of second pixels at a second pixel interval different from the first pixel interval, each of the second pixels including a second predetermined number of second sub-pixels;
irradiating the charged particle beam to each of the first sub-pixels at the first pixel interval for the first region by controlling the charged particle beam column;
irradiating the charged particle beam to each of the second sub-pixels at the second pixel interval by controlling the charged particle beam column;
detecting first secondary electrons for each of the first sub-pixels generated by irradiating the charged particle beam to each of the first sub-pixels at the first pixel interval for the first region;
generating a first signal of the first secondary electrons for each of the first sub-pixels by detecting first secondary electrons;
detecting second secondary electrons for each of the second sub-pixels generated by irradiating the charged particle beam to each of the second sub-pixels at the second pixel interval for the second region;
generating a second signal of the second secondary electrons for each of the second sub-pixels by detecting second secondary electrons;
forming first sub-pixel images by using the first signal, the number of the first sub-pixel images being the first predetermined number;
generating a first image by synthesizing the predetermined number of the first sub-pixel images;
forming second sub-pixel images by using the second signal, the number of the second sub-pixel images being the second predetermined number; and
generating a second image by synthesizing the predetermined number of the second sub-pixel images.

* * * * *